United States Patent
Osborn

(10) Patent No.: US 7,224,215 B2
(45) Date of Patent: May 29, 2007

(54) INTELLIGENT RF POWER CONTROL FOR WIRELESS MODEM DEVICES

(75) Inventor: William R. Osborn, Cary, NC (US)

(73) Assignee: Sony Ericsson Mobile Communications AB (SE)

( * ) Notice: Subject to any disclaimer, the term of this patent is extended or adjusted under 35 U.S.C. 154(b) by 242 days.

(21) Appl. No.: 10/906,450

(22) Filed: Feb. 21, 2005

(65) Prior Publication Data
US 2006/0139099 A1  Jun. 29, 2006

Related U.S. Application Data

(60) Provisional application No. 60/593,245, filed on Dec. 28, 2004.

(51) Int. Cl.
 *H03G 3/20* (2006.01)
(52) U.S. Cl. .......................................... 330/2; 330/129
(58) Field of Classification Search .................... 330/2, 330/129, 285; 455/127.4
 See application file for complete search history.

(56) References Cited

U.S. PATENT DOCUMENTS

| | | | |
|---|---|---|---|
| 7,043,268 B2 * | 5/2006 | Yukie et al. ................. | 455/557 |
| 2002/0158688 A1 | 10/2002 | Terosky et al. | |
| 2003/0155978 A1 | 8/2003 | Pehlke | |
| 2005/0186923 A1 * | 8/2005 | Chen et al. ............... | 455/127.1 |

FOREIGN PATENT DOCUMENTS

EP  1047188 A  10/2000

OTHER PUBLICATIONS

Sony Ericsson Mobile Communications, AB, "International Search Report", International Application No. PCT/US2005/021715, (Oct. 2005).
Sony Ericsson Mobile Communications, AB, "Written Opinion", International Application No. PCT/US2005/021715, (Oct. 2005).

* cited by examiner

*Primary Examiner*—Steven J. Mottola
(74) *Attorney, Agent, or Firm*—Moore & Van Allen PLLC; Gregory A. Stephens

(57) ABSTRACT

A system and method of optimizing the output power of a power amplifier to maintain satisfactory RF response under varying power amplifier operating conditions. The operating conditions include operating temperature, supply voltage, and operating frequency. Existing sensors monitor the aforementioned operating conditions. An application within the wireless device containing the power amplifier continuously or periodically logs the current operating conditions and finds them in a look-up table stored internally. The look-up table is comprised of empirically derived maximum sustainable power output levels for each operating condition. Once the current operating conditions are matched to a set in the table, current power amplifier power output is reset, if necessary, to the maximum sustainable power output defined in the table.

8 Claims, 5 Drawing Sheets

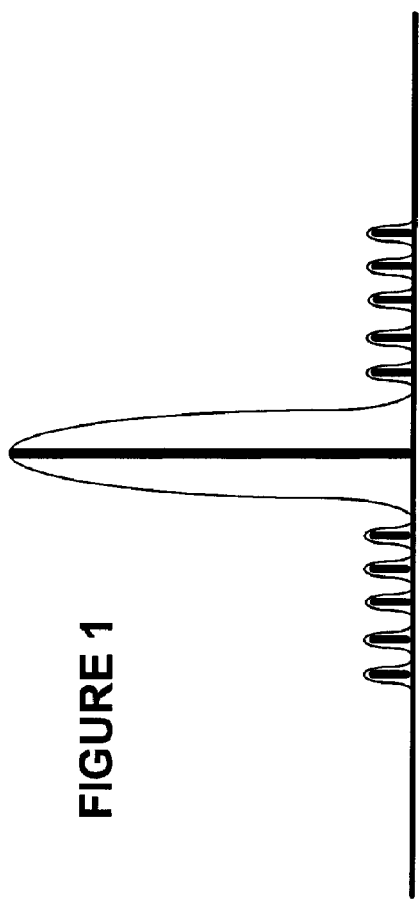
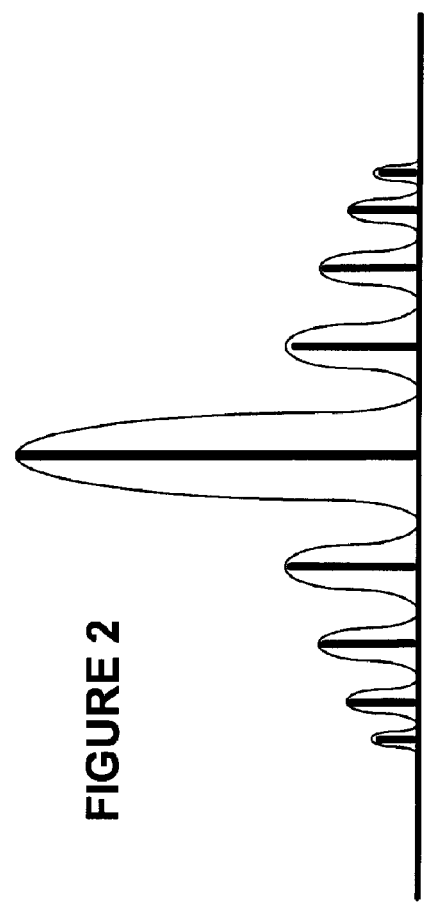

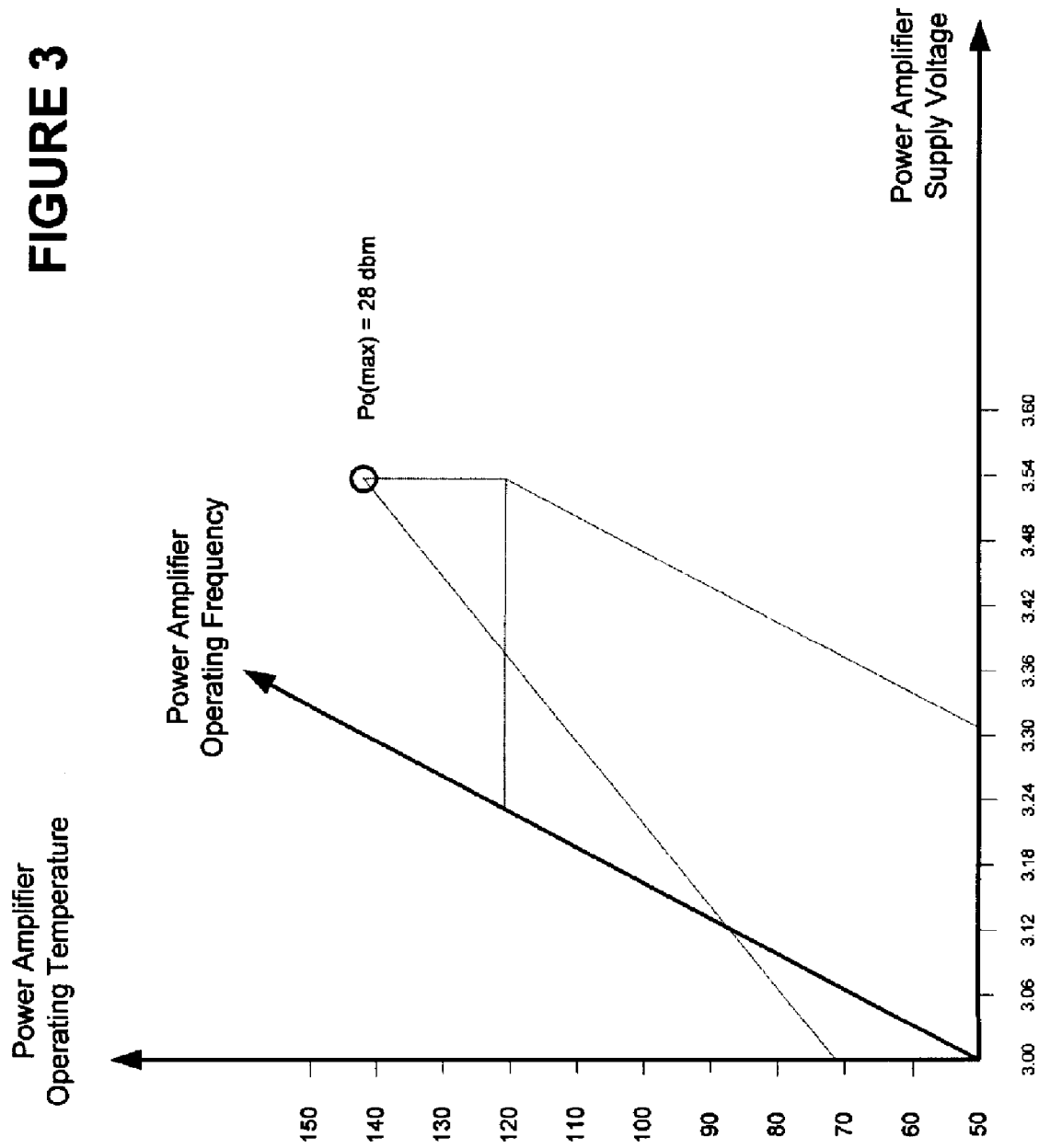

| Po(max) (dbm) | Operating Temperature (°C) | Supply Voltage (Vdc) | Operating Frequency (MHz) |
|---|---|---|---|
| 29.5 | 50 | 3.6 | 824 |
| 29.5 | 60 | 3.6 | 824 |
| 29.5 | 70 | 3.6 | 824 |
| ... | ... | ... | ... |
| 29.5 | 110 | 3.6 | 824 |
| 29.5 | 120 | 3.6 | 824 |
| 29.4 | 130 | 3.6 | 824 |
| 29.4 | 140 | 3.6 | 824 |
| 29.4 | 150 | 3.6 | 824 |
| ... | | | |
| 28.5 | 50 | 3.3 | 836.5 |
| 28.4 | 60 | 3.3 | 836.5 |
| 28.3 | 70 | 3.3 | 836.5 |
| .. | .. | .. | .. |
| 27.7 | 110 | 3.3 | 836.5 |
| 27.6 | 120 | 3.3 | 836.5 |
| 27.5 | 130 | 3.3 | 836.5 |
| 27.4 | 140 | 3.3 | 836.5 |
| 27.3 | 150 | 3.3 | 836.5 |
| ... | | | |
| 26.6 | 50 | 3.0 | 849 |
| 26.5 | 60 | 3.0 | 849 |
| 26.5 | 70 | 3.0 | 849 |
| ... | ... | ... | ... |
| 26.3 | 110 | 3.0 | 849 |
| 26.3 | 120 | 3.0 | 849 |
| 26.2 | 130 | 3.0 | 849 |
| 26.0 | 140 | 3.0 | 849 |
| 26.0 | 150 | 3.0 | 849 |

FIGURE 6

INTELLIGENT RF POWER CONTROL FOR WIRELESS MODEM DEVICES

CROSS-REFERENCE TO RELATED APPLICATIONS

This application claims the benefit of previously filed U.S. Provisional Patent Application Ser. No. 60/593,245 filed on Dec. 28, 2004 entitled, "INTELLIGENT RF POWER CONTROL FOR WIRELESS MODEM DEVICES".

BACKGROUND

PC slot card modems are generally required to operate at 3.3 volts (dc) ±10% for a rough range of 3.0 to 3.6 Vdc. Typical Power amplifier devices on the market, however, are optimized to work using a lithium ion battery that has a nominal voltage of 3.6 Vdc and an end-of-life at 3.2 Vdc. For a given power amplifier, its maximum output power with good spectral characteristics is a function of operating temperature, operating frequency, and operating voltage.

$$P_{o(max)} = f\{t, f, v\}$$

The operating parameters of the power amplifier may vary with ambient conditions, supply voltage, and what part of the allocated cellular frequency band is currently being used. Typically, a wireless carrier will specify the nominal, minimum, and maximum output power they want for wireless devices on their network since the power amplifier's output directly affects the communication range between the nearest network basestation and the wireless device. RF power output is typically maintained at a nominal level of +28 dbm +/−3 dbm for instance. A problem arises when one or more of the operating conditions exceeds the power amplifier's optimal operating range while the power output is maintained at nominal or higher levels. In such cases the power amplifier RF spectral response begins to degrade in quality and, if left to continue, may degrade to the point that useful communications are compromised.

Often if the RF power output were allowed to be reduced even slightly, then the RF spectral response between the wireless device and the nearest basestation can be maintained at acceptable levels with a minimal impact to the effective range of the wireless device.

Common engineering practice today is to set the nominal RF output power lower than the power amplifier's capability at nominal operating conditions to allow for further degradation at the worst case operating condition extremes. Since the operating condition extreme exists only a small percentage of the total time a cellular terminal is in use, the RF output power is unnecessarily controlled to lower than optimal levels most of the time.

What is needed is an intelligent monitoring and adjustment system that can monitor and incrementally adjust the RF power output of the power amplifier to continuously maintain the maximum output achievable while assuring good RF spectral performance.

SUMMARY

The present invention describes a method of optimizing the power amplifier output power to maintain satisfactory RF response under varying power amplifier operating conditions. The operating conditions include operating temperature, supply voltage, and operating frequency. The present invention takes advantage of existing sensors that monitor the aforementioned operating conditions albeit for different purposes. An application within the wireless device containing the power amplifier continuously or periodically logs the current operating conditions and finds them in a look-up table stored internally. The look-up table is comprised of empirically derived maximum sustainable power output levels for each operating condition. Once the current operating conditions are matched to a set in the table, the current power amplifier power output is reset, if necessary, to the maximum sustainable power output defined in the table.

BRIEF DESCRIPTION OF THE DRAWINGS

FIG. 1 is a graph of a relatively good RF response between a wireless device and its nearest basestation.

FIG. 2 is a graph of a degrading RF response between a wireless device and its nearest basestation.

FIG. 3 is a graph showing the relationship among temperature, voltage, and frequency as they relate to the output power ($P_o$) of a power amplifier.

FIG. 6 is a partial table of example empirical data for specified ranges of the power amplifier operating conditions of temperature, voltage, and frequency.

DETAILED DESCRIPTION

The present invention comprises a system that uses temperature sensors, input voltage sensors, and transmit channel information already present in wireless transceiver devices to provide input data for an algorithm that determines whether the power output of the power amplifier should be adjusted.

FIG. 1 is a graph of a relatively good RF spectral response between a wireless device and its nearest basestation. When the power amplifier is operating within the nominal ranges for the operating conditions of temperature, voltage, and frequency, the RF spectral sidelobes are normally well below allowable limits and cause little or no interference with other channels.

FIG. 2, by contrast, is a graph of a degrading RF response between a wireless device and its nearest basestation. When the power amplifier strays from one or more of the nominal ranges for the operating conditions of temperature, voltage, and frequency, the RF response for the nominal $P_o$ may exhibit spurious sidelobes that can cause interference with other channels.

The goal of the present invention is to control the $P_o$ of the power amplifier so that the RF spectral response between a wireless device and its nearest basestation resembles that shown in FIG. 1.

FIG. 3 is a graph showing the relationship among temperature, voltage, and frequency as they relate to the output power ($P_o$) of a power amplifier. FIG. 3 illustrates how empirical data for a given power amplifier is obtained. A table of values is compiled for $P_o$ in which the three operating conditions are varied and the RF spectral response is observed. First, the nominal ranges for each operating condition are set. For purposes of illustration, the power amplifier semiconductor device temperature range was specified to be between 50 C and 150 C in increments of 10 C, voltage was specified to be between 3.0 Vdc and 3.6 Vdc in increments of 0.06 Vdc, and frequency was specified to be between 824 MHz and 849 MHz in increments of 2.5 Mhz.

The increments were chosen to split each range into 10 segments. Thus, there are 1000 ($10^3$) $P_o$ values observed. Using automated engineering testing equipment the empirical data can be quickly compiled by holding two operating conditions constant while adjusting the third. The RF response is observed at each data set point. If the RF response is satisfactory, the nominal $P_o$ value is raised until just below the point of degradation or until it reaches the carrier's maximum power output specification. If the RF response is unsatisfactory then the $P_o$ is lowered until a satisfactory RF response is observed. The new $P_o$ level is then noted in the table for the current data set point. After all 1000 data set points have been tested there will be a table of $P_{o(max)}$ values corresponding to each data set point.

Figure 4:
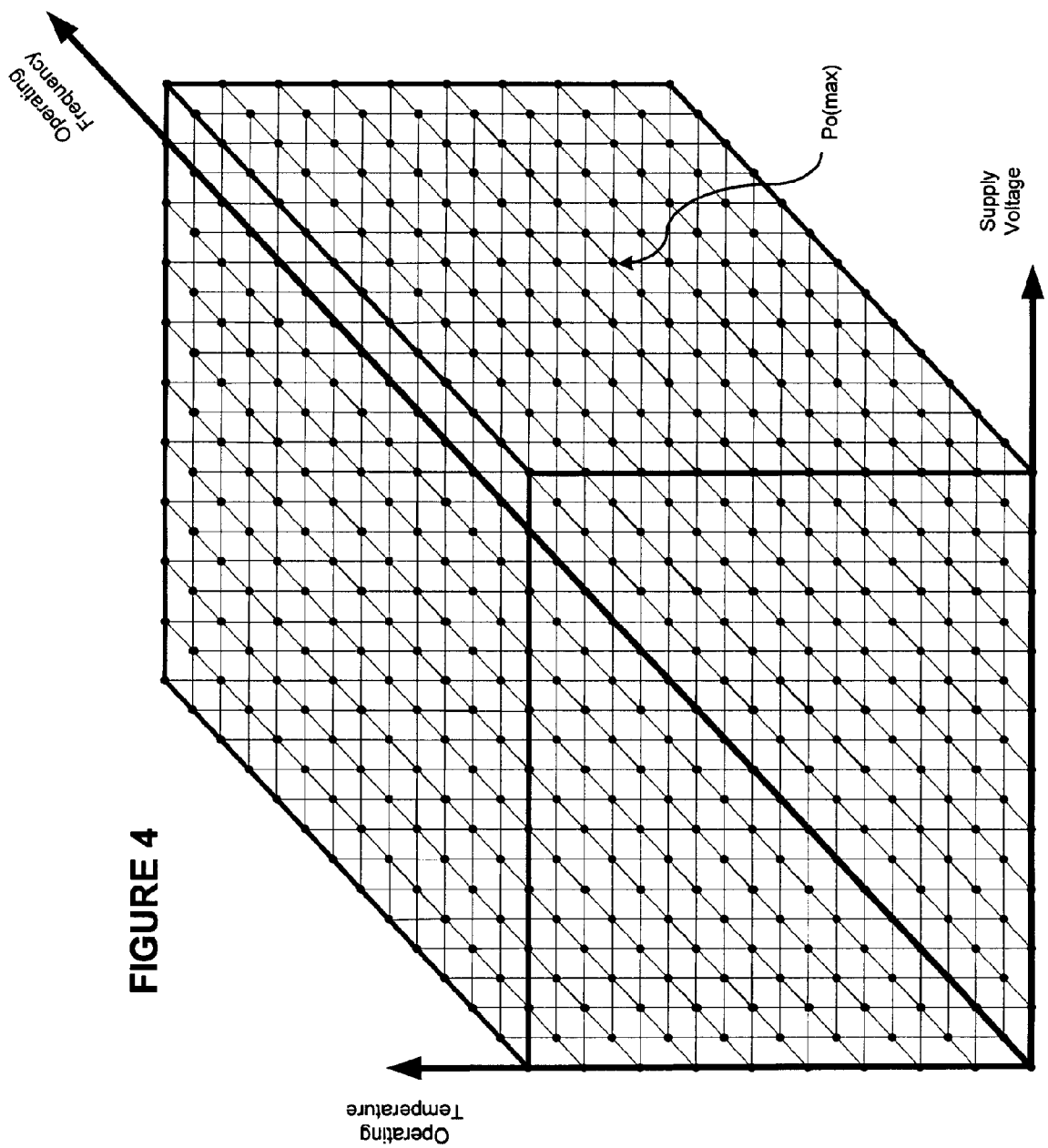
FIG. 4 is a 3-D graph showing $P_{o(max)}$ values empirically derived for specified ranges of the power amplifier operating conditions of temperature, voltage, and frequency.

FIG. 4 is a 3-D graph showing the table of $P_{o(max)}$ values empirically derived for specified ranges of the power amplifier operating conditions of temperature, voltage, and frequency. Every data point represents a good RF response. However, every data point does not have a $P_{o(max)}$ of 28 dBm which is the nominal value. For some data points the $P_o$ of the power amplifier was reduced or increased in order to obtain the maximum RF output with good spectral response.

The present invention stores this table in memory on the wireless device. The wireless device also utilizes its own sensors to obtain the instantaneous operating conditions for temperature, voltage, and frequency. A software application resident on the mobile device then periodically compares the instantaneous operating conditions against those stored in the table to determine the highest $P^o$ sustainable that will still yield a good RF response between the wireless device and the nearest basestation.

Figure 5:
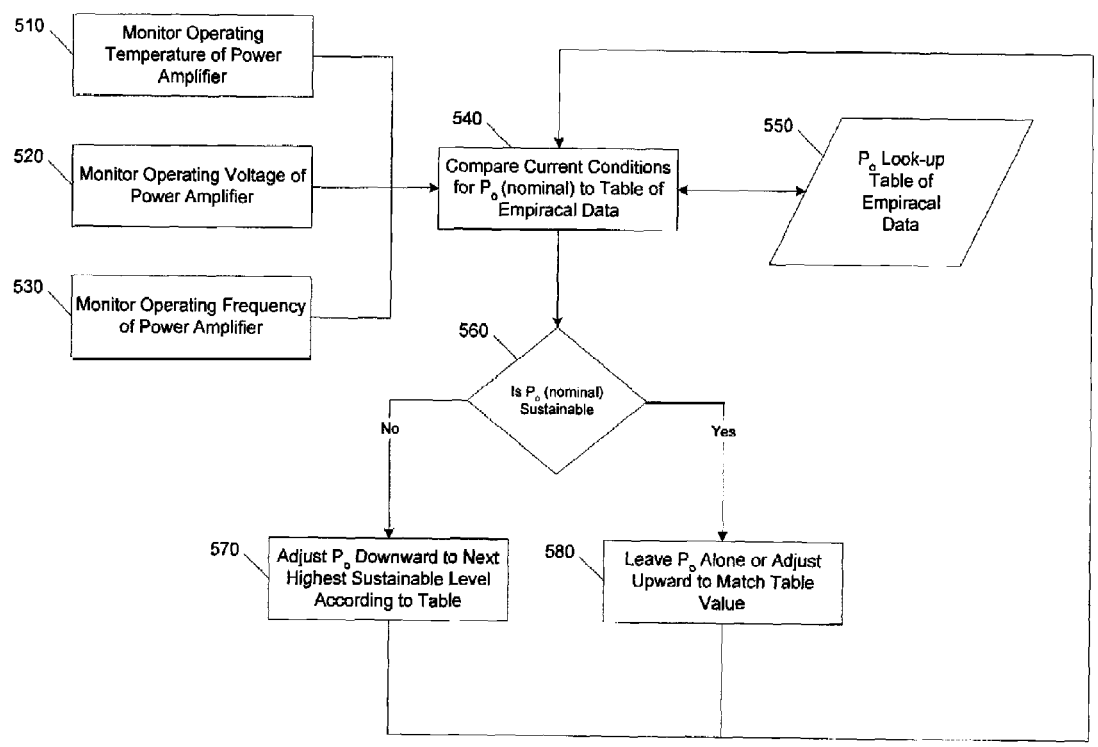
FIG. 5 is a flowchart illustrating the software processes of the present invention.

FIG. 5 is a flowchart illustrating the software processes of the present invention. The process begins by monitoring the operating conditions of the power amplifier. This includes monitoring the current operating temperature 510, supply voltage 520, and operating frequency 530 of the power amplifier. These values are logged and compared 540 to the empirically derived values stored in a look-up table in memory 550. After performing some relatively simple interpolation on the current data to bring it in line with one of the data set points in the table, the optimal $P_{o(max)}$ value is determined from the table 560. If the table's $P_{o(max)}$ is less than the current operating $P_o$ of the power amplifier then the current $P_o$ of the power amplifier is adjusted to match the table $P_{o(max)}$ specifications 570. This ensures that the RF response between the wireless device and the nearest basestation will remain satisfactory while utilizing the highest possible $P_{o(max)}$. If the table's $P_{o(max)}$ is equal to or greater than the current operating $P_o$ of the power amplifier then the current $P_o$ of the power amplifier is left alone or increased to match 580 the table $P_{o(max)}$ specifications again insuring the highest possible $P_{o(max)}$ that can sustain satisfactory RF response. The monitoring and comparing process can run continuously in the background or be checked at periodic intervals.

FIG. 6 is a partial table of example empirical data for specified ranges of the power amplifier operating conditions of temperature, voltage, and frequency. As described earlier the table is generated using empirical test data. First the operating conditions and their respective ranges are defined for the power amplifier of the wireless device. In the present example, the power amplifier's operating temperature spans 50 C to 150 C. This is a fairly typical range for the power amplifier device's working environment. The supply voltage range was set between 3.0 and 3.6 vdc. This roughly corresponds to the wireless modem device requirements of 3.3 vdc±10%. Lastly, the operating frequency was set between 824-849 MHz which corresponds to the allocated bandwidth for the U.S. GSM 850 Mhz band. Next, the $P_o$ is initialized to its nominal value. For the present example the nominal value is 28 dbm and the three operating conditions are set to their base values. The RF response is observed and the nominal $P_o$ is either increased or decreased until an optimum value of power is reached with good performance. This adjusted $P_o$ value is then recorded into the table as the $P_{o(max)}$ that can sustain a good RF response for that particular set of operating conditions.

The $P_o$ is reset to the nominal value and the operating conditions are set to the next data point and the process is repeated until all the data points have been empirically tested and a $P_{o(max)}$ for each has been recorded into the table.

The numbers and ranges chosen for the example illustration are not intended to be limiting of the present invention. The numbers are purely exemplary to provide a context for how the present invention would react to changing operating conditions for a power amplifier. One of ordinary skill in the art could readily derive a different set of ranges for the operating conditions of a power amplifier and apply the principles of the present invention to achieve the goal optimal power output and good RF response.

Computer program elements of the invention may be embodied in hardware and/or in software (including firmware, resident software, micro-code, etc.). The invention may take the form of a computer program product, which can be embodied by a computer-usable or computer-readable storage medium having computer-usable or computer-readable program instructions, "code" or a "computer program" embodied in the medium for use by or in connection with the instruction execution system. In the context of this document, a computer-usable or computer-readable medium may be any medium that can contain, store, communicate, propagate, or transport the program for use by or in connection with the instruction execution system, apparatus, or device. The computer-usable or computer-readable medium may be, for example but not limited to, an electronic, magnetic, optical, electromagnetic, infrared, or semiconductor system, apparatus, device, or propagation medium such as the Internet. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner. The computer program product and any software and hardware described herein form the various means for carrying out the functions of the invention in the example embodiments.

Specific embodiments of an invention are disclosed herein. One of ordinary skill in the art will readily recognize that the invention may have other applications in other environments. In fact, many embodiments and implementations are possible. The following claims are in no way intended to limit the scope of the present invention to the specific embodiments described above. In addition, any recitation of "means for" is intended to evoke a means-plus-function reading of an element and a claim, whereas, any elements that do not specifically use the recitation "means for", are not intended to be read as means-plus-function elements, even if the claim otherwise includes the word "means".

What is claimed is:

1. A method of optimizing the output power of a power amplifier to maintain satisfactory RF response under varying power amplifier operating conditions including operating temperature, supply voltage, and operating frequency, the method comprising:
- monitoring the current operating temperature of the power amplifier;
- monitoring the current supply voltage of the power amplifier;
- monitoring the current operating frequency of the power amplifier;
- finding the current operating temperature, current supply voltage, and current operating frequency values in a look-up table, the look-up table comprised of empirically derived maximum sustainable power output levels for each operating condition; and
- setting the current power amplifier power output to the maximum sustainable power output defined in the table.

2. A system of optimizing the output power of a power amplifier to maintain satisfactory RF response under varying power amplifier operating conditions including operating temperature, supply voltage, and operating frequency, the method comprising:
- means for monitoring the current operating temperature of the power amplifier;
- means for monitoring the current supply voltage of the power amplifier;
- means for monitoring the current operating frequency of the power amplifier;
- means for finding the current operating temperature, current supply voltage, and current operating frequency values in a look-up table, the look-up table comprised of empirically derived maximum sustainable power output levels for each operating condition; and
- means for setting the current power amplifier power output to the maximum sustainable power output defined in the table.

3. A computer program product embodied on a computer readable medium for optimizing the output power of a power amplifier to maintain satisfactory RF response under varying power amplifier operating conditions including operating temperature, supply voltage, and operating frequency, the computer program product comprising:
- computer program code for monitoring the current operating temperature of the power amplifier;
- computer program code for monitoring the current supply voltage of the power amplifier;
- computer program code for monitoring the current operating frequency of the power amplifier;
- computer program code for finding the current operating temperature, current supply voltage, and current operating frequency values in a look-up table, the look-up table comprised of empirically derived maximum sustainable power output levels for each operating condition; and
- computer program code for setting the current power amplifier power output to the maximum sustainable power output defined in the table.

4. A wireless modem device capable of optimizing the output power of a power amplifier to maintain satisfactory RF response under varying power amplifier operating conditions including operating temperature, supply voltage, and operating frequency, the wireless modem device comprising:
- a temperature sensor for monitoring the current operating temperature of the power amplifier;
- a voltage sensor for monitoring the current supply voltage of the power amplifier;
- a frequency sensor for monitoring the current operating frequency of the power amplifier; and
- a software application executable by a processor and coupled with the temperature sensor, voltage sensor, and frequency sensor, the software application for:
  - looking up the current operating temperature, current supply voltage, and current operating frequency values, as determined by the temperature sensor, voltage sensor, and frequency sensor, in a look-up table, the look-up table comprised of empirically derived maximum sustainable power output levels for each operating condition; and
  - setting the current power amplifier power output to the maximum sustainable power output defined in the look-up table for the current operating temperature, current supply voltage, and current operating frequency values, as determined by the temperature sensor, voltage sensor, and frequency sensor.

5. The method of claim 1 wherein the temperature, voltage, and frequency sensors are updated on a periodic basis and the current power amplifier power output is reset to the maximum sustainable power output defined in the look-up table for the updated operating temperature, current supply voltage, and current operating frequency values, as determined by the temperature sensor, voltage sensor, and frequency sensor.

6. The system of claim 2 wherein the temperature, voltage, and frequency sensors are updated on a periodic basis and the current power amplifier power output is reset to the maximum sustainable power output defined in the look-up table for the updated operating temperature, current supply voltage, and current operating frequency values, as determined by the temperature sensor, voltage sensor, and frequency sensor.

7. The computer program product embodied on a computer readable medium of claim 3 wherein the temperature, voltage, and frequency sensors are updated on a periodic basis and the current power amplifier power output is reset to the maximum sustainable power output defined in the look-up table for the updated operating temperature, current supply voltage, and current operating frequency values, as determined by the temperature sensor, voltage sensor, and frequency sensor.

8. The wireless modem device of claim 4 wherein the temperature, voltage, and frequency sensors are updated on a periodic basis and the current power amplifier power output is reset to the maximum sustainable power output defined in the look-up table for the updated operating temperature, current supply voltage, and current operating frequency values, as determined by the temperature sensor, voltage sensor, and frequency sensor.

* * * * *